United States Patent [19]

Takamura

[11] Patent Number: 5,031,334

[45] Date of Patent: Jul. 16, 1991

[54] ALIGNING METHOD AND APPARATUS FOR ATTACHING A PRINTING PLATE TO A PLATE HOLDER

[75] Inventor: Tohru Takamura, Tokyo, Japan

[73] Assignee: Kabushiki Kaisha Shinkawa, Tokyo, Japan

[21] Appl. No.: 568,980

[22] Filed: Aug. 17, 1990

[30] Foreign Application Priority Data

Aug. 26, 1989 [JP] Japan .................................. 1-219749

[51] Int. Cl.⁵ ........................ B41B 11/00; H04N 7/18
[52] U.S. Cl. ....................................... 33/621; 33/614; 33/645; 358/107; 101/DIG. 36
[58] Field of Search ................................. 33/613–621, 33/645, 1 M; 358/107; 101/DIG. 36

[56] References Cited

U.S. PATENT DOCUMENTS

| | | | |
|---|---|---|---|
| 4,520,389 | 5/1985 | Hornschuh | 33/617 |
| 4,626,907 | 12/1986 | Schedewie | 358/107 |
| 4,635,373 | 1/1987 | Miyazaki et al. | 33/645 |
| 4,641,244 | 2/1987 | Wilson et al. | 358/107 |
| 4,743,324 | 5/1988 | Boyce et al. | 33/621 |
| 4,827,626 | 5/1989 | Wieland | 33/620 |
| 4,934,064 | 6/1990 | Yamaguchi et al. | 33/1 M |
| 4,962,423 | 10/1990 | Yamada et al. | 358/107 |

FOREIGN PATENT DOCUMENTS 0177885 4/1986 European Pat. Off. .... 101/DIG. 12

Primary Examiner—William A. Cuchlinski, Jr.
Assistant Examiner—Alvin Wirthlin
Attorney, Agent, or Firm—Koda and Androlia

[57] ABSTRACT

An aligning method including steps of placing a printing plate on a transparent plate-carrier which is driven in vertical and horizontal directions; photographing the printing plate and a plate holder, to which the printing plate is to be attached, via a camera from below the plate-carrier; matching standard lines of the plate holder and printing plate with the cross lines of a monitor; lowering the plate holder until the plate holder comes into contact with the printing plate, then attaching the printing plate to the plate holder. The device for such method includes: a plate holder; a plate holder driver which drives the plate holder vertically and horizontally; a plate-carrier installed apart from printing position; a plate-carrier drive drives the plate-carrier in the vertical and horizontal directions; a camera installed below the plate-carrier so that the camera takes pictures of the standard lines of the plate holder and printing plate; and a monitor reproducing the image obtained by the camera. With such an arrangement, the standard lines of the plate holder and printing plate can easily be matched with the cross lines of the monitor, performing a accurate attachment of a printing plate to the print holder.

2 Claims, 2 Drawing Sheets

ALIGNING METHOD AND APPARATUS FOR ATTACHING A PRINTING PLATE TO A PLATE HOLDER

BACKGROUND OF THE INVENTION

1. Field of the Invention

The present invention relates to an aligning method and apparatus used in letterpress printing and more particularly to a method and apparatus for attaching a printing plate to a plate holder.

2. Prior Art

Conventionally, printing plates are attached to plate holders as follows: a printing plate is first removed from a plate holder attachment while a two-sided tape is put on the attachment surface of a plate holder. Then, the printing plate is next clamped by pincette and placed on the attachment surface of the plate holder in a manner that the printing plate matches the standard line of the attachment surface. Thereafter, the upper surface of the printing plate is pressed with a flat item so that the printing plate is adhered to the two-sided tape.

Since the above described conventional technique is performed manually, the printing plate is not always accurately attached to the plate holder. Thus, skillfulness is required. In addition, after the printing plate is attached, printing is performed. Positional discrepancy is then checked, whether or not any has occurred. If a positional discrepancy is found, the printing plate is removed and then attached again manually with a visual estimate. Removing and re-attaching are repeated until positional discrepancy is eliminated. Accordingly, a considerable amount of time is required for corrections, and since the printing plate is attached manually, the printing plate can easily change its shape.

SUMMARY OF THE INVENTION

Accordingly, the object of the present invention is to provide an aligning marking method and apparatus therefor by which a printing plate is bonded to a plate holder easily and accurately in a short period of time without changing the shape of the printing plate.

The aligning method of the present invention includes the steps of: placing a printing plate on a transparent plate-carrier which is driven in the X, Y and θ directions; photographing the printing plate and a plate holder, to which the printing plate is to be attached, via a camera from below the plate-carrier; matching standard lines of the plate holder and printing plate with the cross lines of a monitor; and lowering the plate holder so that the plate holder comes into contact with the printing plate so as to attach the printing plate to the plate holder.

The aligning apparatus of the present invention includes: a plate holder to which a printing plate is attached; a plate holder driving means which drives the plate holder in the X, Y, and Z direction; a plate-carrier for carrying the printing plate thereon and installed apart from printing position; a plate-carrier driving means which drives the plate-carrier in the X, Y, and θ directions; a camera provided below the plate-carrier so that the camera takes picture of the standard lines of the plate holder and printing plate; and a monitor which reproduces the image obtained by the camera. With such an arrangement, the standard lines of the plate holder and printing plate can easily be matched with the cross lines of the monitor.

In operation, pictures of the plate holder and printing plate are taken by the camera, and the plate holder and printing plate are moved so that the standard lines drawn on the plate holder and printing plate are matched with the cross lines of the monitor. Thus, the standard lines of the printing plate are even with the standard lines on the plate holder. Then, the plate holder is lowered until it contacts the printing plate. If a two-sided tape is attached to the plate holder, the printing plate is attached to the plate holder by the two-sided tape; if a vacuum suction part is provided on the plate holder, the printing plate is attached to the plate holder by vacuum suction.

DETAILED DESCRIPTION OF THE INVENTION

Figure 1:
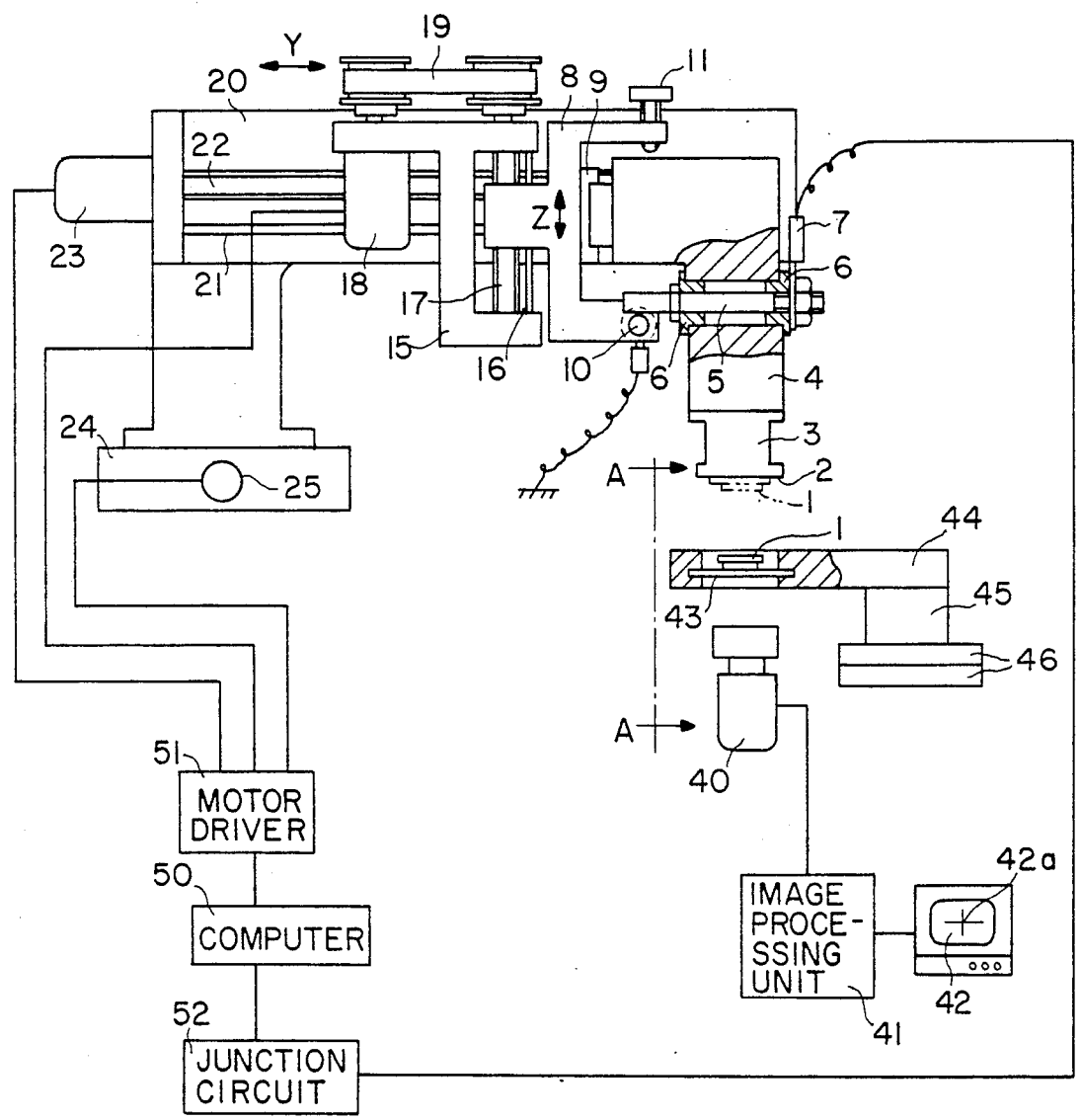
FIG. 1 is an explanatory diagram illustrating one embodiment of the present invention.

As shown in FIG. 1, a printing plate (rubber stamp) 1 is attached to a plate holder 3 via a transparent or semi-transparent two-sided tape 2.

The plate holder 3 is mounted on a plate holder mount 4 so that the plate holder 3 is free to be mounted and dismounted. A contact rod 5 made of conductive material is coupled to the plate holder mount 4 through insulators 6, and a terminal 7 is coupled to one end of the contact rod 5.

The plate holder mount 4 is installed on a first moving table 8 via a linear guide 9 so that the plate holder mount 4 can move up and down. A contact rod 10 is made of a conductive material and supports the undersurface of the contact rod 5. The contact rod 10 is fastened to the lower end of the first moving table 8. A stopper 11 is screwed into the upper end of the first moving table 8 so that the stopper 11 faces the upper surface of the plate holder mount 4.

When the first moving table 8 moves up and down, the plate holder mount 4 moves along with this first moving table 8 via the contact rods 10 and 5. An adjustment is made so as to create a gap of approximately 50 microns between the stopper 11 and the plate holder mount 4 when the contact rods 5 and 10 are in contact with each other.

The first moving table 8 slides on a guide rod 16 which is provided vertically on a second moving table 15. The first moving table 8 is screw-engaged with a Z-direction feed screw 17 which is parallel to the guide rod 16 on the second moving table 15. The Z-direction feed screw 17 is driven by a belt 19 via a Z-direction driving motor 18 mounted on the second moving table 15.

The second moving table 15 slides on a guide rod 21 provided, in the horizontal Y direction, on third moving table 20. The second moving table 15 is screw-engaged with a Y-direction feed screw 22 which is parallel to the guide rod 21 on the third moving table 20.

The Y-direction feed screw 22 is driven by a Y-direction driving motor 23 mounted on the third moving table 20. The third moving table 20 slides in the horizontal X direction on a base 24 and is driven by an X-direction feed screw (not shown) via an X-direction driving motor 25 which is fixed to the base 24.

With the structure above, when the Z-direction driving motor 18 is driven, the Z-direction feed screw 17 rotates via the belt 19, and the first moving-table 8 is moved in the Z direction. As a result, the plate holder 3 is moved in the Z direction together with the plate holder mount 4.

When the Y-direction driving motor 23 is driven, the second moving table 15 is moved in the Y direction by the Y-direction feed screw 22. Thus, the plate holder 3 is moved in the Y direction.

Similarly, when the X-direction driving motor 25 is driven, the third moving table 20 is moved in the X direction, and the plate holder 3 is also moved in the X direction.

Figure 2:
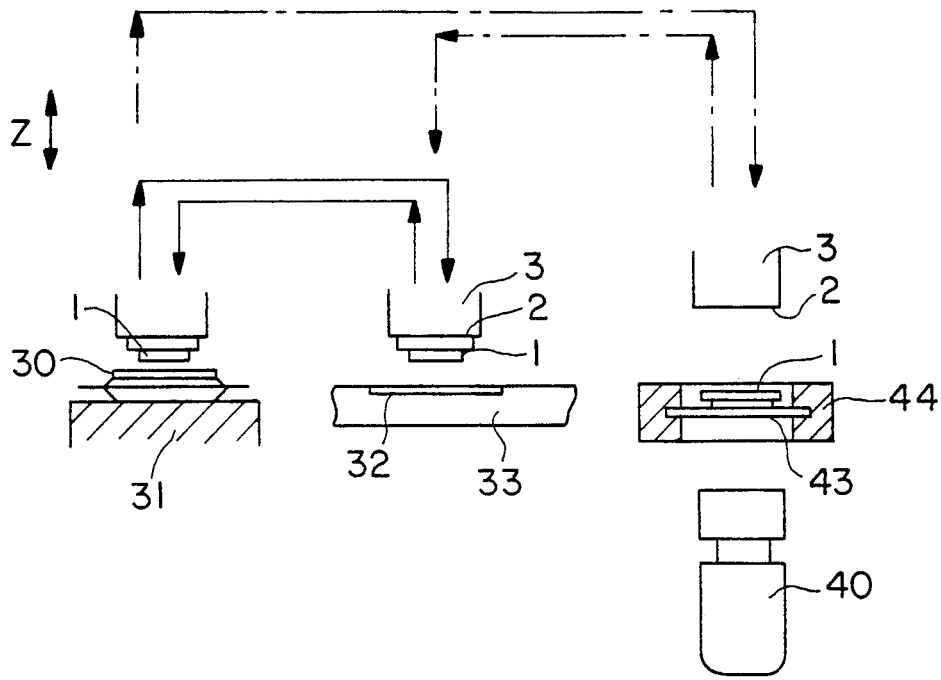
FIG. 2 is a view taken along the line A-A of FIG. 1, showing the printing operation.

As shown in FIG. 2, an ink stand 33 holding ink 32 is provided at a position which, in the X direction, is apart from the position of a work piece-carrying table 31 on which the work piece 30 is placed.

A camera 40 is installed apart from the work piece-carrying table 31 with its imaging or photographing surface directed upward. Image or photograph signals from the camera 40 are processed by image processing unit 41 and displayed on a monitor 42.

Installed above the camera 40 is a transparent plate-carrier 43. The plate-carrier 43 is attached to a plate-carrying table 44 which is mounted to a $\theta$-direction driving table 45 of known structure. The $\theta$-direction driving table 45 is mounted to an X-Y direction driving table 46 which is also of known structure. The $\theta$-direction driving table 45 and X-direction driving table 46 are driven manually or by ordinary electrical chessman.

Figure 3A:
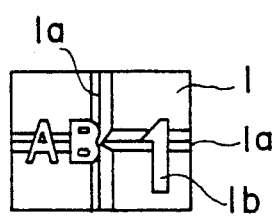
FIG. 3(a) is a top view of the printing plate.
Figure 4:
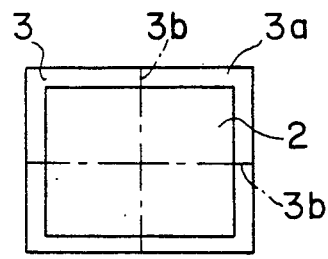
FIG. 4 is an explanatory diagram showing an attachment surface of plate holder with two-sided tape attached.
Figure 3B:
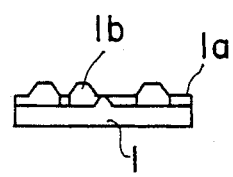
FIG. 3(b) is a side view thereof.

FIGS. 3(a) and 3(b) show positioning lines 1a formed on the printing plate 1 so as to be lower than the print characters 1b. Shown in FIG. 4 is cross-form standard lines 3b formed beforehand on the attachment surface 3a of the plate holder 3.

As seen from FIG. 1, the Z-direction driving motor 18, Y-direction driving motor 23 and X-direction driving motor 25 are driven via motor driver 51 by command signals from the computer 50. A program which controls the printing operation (indicated by the solid line arrows in FIG. 2) and a program which controls the printing plate attachment operation (indicated by the dot lines in FIG. 2) are stored beforehand in the computer 50. The terminal 7 is connected to the computer 50 via a junction circuit 52, and the contact rod 10 is connected to a grounding line.

With the above structure, printing is performed by repeating the operation indicated by the solid lines in FIG. 2 which is done via the motor driver 51 in accordance with the printing operation program stored in the computer 50. More specifically, by a combination adjustment movements of the plate holder 3 in the Z direction (caused by the Z-direction motor 18) and movements of the plate holder 3 in the horizontal direction (caused by the Y-direction driving motor 23 and X-direction driving motor 25), ink 32 is applied to the printing plate 1. Then, printing is performed on the work piece 30, which is then fed out a fixed pitch.

The method for attaching a printing plate will be described below:

Attachment of the printing plate 1 is done whenever an old printing plate has worn out as a result of repeated printing operations or when the printing plate is installed on the plate holder 3 for the first time.

When a replacement of the printing plate is necessary, a printing plate attachment button is pressed, so that the operation indicated by the dot lines in FIG. 2 is performed via the motor driver 51 in accordance with the printing plate attachment operation program stored in the computer 50.

First, the printing plate 1 is set above the camera 40 via a combination of movements of the plate holder 3 in the Z direction (caused by the Z-direction driving motor 18) and the horizontal direction (caused by the Y-direction driving motor 23 and X-direction driving motor 25). Then, the printing plate 1 which is to be replaced is removed from the plate holder 3.

When the attachment button is pressed again, the plate holder 3 is lowered so that the printing plate attachment surface of the plate holder 3 is positioned so as to be focused by the camera 40. The focus of the camera 40 has been set beforehand, and the focus of the camera is set slightly above the plate-carrying table 44. The cross-shaped lines 42a of the monitor 42 and the standard lines 3b of the plate holder 3 are then matched with each other.

When the printing plate 1 is attached to the plate holder 3 for the first time, the following operation is performed: with the transparent or semi-transparent two-sided tape 2 bonded to the plate holder 3 and no printing plate 1 placed on the plate-carrier 43, the plate holder 3 is positioned above the camera 40. An electrical chessman (joystick) is then operated so that the Z-direction driving motor 18 is driven and the plate holder 3 is lowered, thus the camera is focused upon the printing plate attachment surface of the plate holder 3.

Next, the electrical chessman is operated so that the Y-direction driving motor 23 and X-direction driving motor 25 are driven, and the standard lines 3b of the plate holder 3 are aligned with the cross lines of the monitor 42. This result of this operation is stored in the computer.

The printing plate 1 is next placed on the platecarrier 43, and the lens focus adjustment mechanism of the camera 40 is operated so that the focus of the camera 40 is placed on the positioning lines 1a of the printing plate 1. Instead, the camera 40 may be provided on a mechanism which makes up and down movements so that the camera 40 as a whole is moved vertically and adjusted within the depth of field of the lens.

The $\theta$-direction driving table 45 and X-Y direction driving table 46 are driven in the X-Y and $\theta$ directions either manually or by prior art electrical chessman so that the positioning lines 1a of the printing plate 1 are aligned with the cross lines of the monitor 42. Thus, the positioning lines 1a on the printing plate 1 are aligned with standard lines 3b of the plate holder 3.

When a start button is pressed, the Z-direction driving motor 18 is driven by a predetermined program so that plate holder 3 is lowered. The plate holder 3 can be lowered also by operating the Z-direction driving motor 18 one pulse at time. As a result, the two-sided tape 2 on the plate holder 3 comes into contact with the printing plate 1.

Then, by the weight of the plate holder 3, plate holder mount 4 and elements 5 through 7 mounted to the plate holder mount 4, the contact rod 5 is lowered in accordance with the lowering motion of the contact rod 10 while maintaining a contact with the contact rod 10 to a point where the printing plate 1 is crushed. Afterward, the plate mount 4 stops lowering, and the first moving table 8 alone is lowered so that the contact rod 10 separates from the contact rod 5, thus causing an "off" signal to be outputted from the terminal 7. The "crushing amount" of the printing plate 1 varies depending upon the material thereof, and normally this value is approximately 50 microns. Based upon this amount, the first moving table 8 is lowered an additional 0.1 to 0.2 mm from the detection point. As a result, after the first moving table 8 has been lowered the distance corresponding to the gap between the stopper 11 and the plate holder mount 4, the table 8 presses down the plate holder mount 4 via the stopper 11, so that the two-sided tape 2 attached to the plate holder 3 is bonded to the printing plate 1. Thus, the printing plate 1 is attached to the plate holder 3.

After this, when the start button is pressed (in cases where the plate holder 3 is lowered by operating the electrical chessman), or after the above-described operation (in cases where the operation is performed automatically), the plate holder 3 is moved up to a point above the ink 32. Printing is then performed on the work piece 30 via an ordinary printing operation.

In the embodiment described above, the printing plate 1 is attached to the plate holder 3 via the two-sided tape 2. However, it would be possible to install a vacuum suction part on the plate holder 3 so as to attach the printing plate 1 directly to the plate holder 3 by vacuum suction.

As is clear from the above description, according to the present invention, the plate holder and printing plate are photographed, and the plate holder and the printing plate are aligned with the cross lines of a monitor. Then, the plate holder is lowered to contact the printing plate, and the printing plate is attached to the plate holder. Accordingly, the printing plate is attached to the plate holder easily and accurately in a short period of time, without changing the shape of the printing plate.

I claim:

1. An aligning method for attaching a printing plate to a plate holder characterized in that:

a printing plate is placed on a transparent plate-carrier which is driven in the X, Y, and $\theta$ directions;

said printing plate and a plate holder to which said printing plate is to be attached are photographed by a camera from below said plate-carrier;

standard lines on said plate holder and printing plate are matched with cross lines of a monitor; and said plate holder is then lowered so that said plate holder contacts said printing plate to attach said printing plate to said plate holder.

2. An aligning method for attaching a printing plate to a plate holder apparatus characterized in that said aligning apparatus comprises:

a plate holder to which a printing plate is attached;

a plate holder driving means which drives said plate holder in the X, Y, and Z directions, a plate-carrier which carries said printing plate and is installed at a position apart from a printing position;

a plate carrier driving means which drives said plate-carrier in the X, Y, and $\theta$ directions, a camera installed below said plate-carrier, said camera photographing standard lines of said plate holder and plate, and a monitor which reproduces an image obtained by wherein standard lines on said plate holder and printing plate are matched with cross lines of said monitor.

* * * * *